United States Patent
Cha et al.

(10) Patent No.: US 7,033,908 B2
(45) Date of Patent: Apr. 25, 2006

(54) METHODS OF FORMING INTEGRATED CIRCUIT DEVICES INCLUDING INSULATION LAYERS

(75) Inventors: Yong-Won Cha, Gyeonggi-do (KR); Won-Jin Kim, Gyeonggi-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 54 days.

(21) Appl. No.: 10/775,677

(22) Filed: Feb. 10, 2004

(65) Prior Publication Data

US 2004/0161919 A1 Aug. 19, 2004

(30) Foreign Application Priority Data

Feb. 14, 2003 (KR) .................. 10-2003-0009476

(51) Int. Cl.
*H01L 21/76* (2006.01)

(52) U.S. Cl. .................. 438/435; 438/424; 438/597; 438/624

(58) Field of Classification Search ................ 438/424, 438/435, 624, 597, 253

See application file for complete search history.

(56) References Cited

U.S. PATENT DOCUMENTS

| 5,747,382 | A  | * | 5/1998  | Huang et al.        | 438/624 |
| 6,030,881 | A  | * | 2/2000  | Papasouliotis et al. | 438/424 |
| 6,150,238 | A  |   | 11/2000 | Wu et al.           |         |
| 6,204,161 | B1 | * | 3/2001  | Chung et al.        | 438/612 |
| 6,348,375 | B1 | * | 2/2002  | Lee et al.          | 438/253 |
| 6,423,630 | B1 |   | 7/2002  | Catabay et al.      |         |
| 6,798,038 | B1 | * | 9/2004  | Sato et al.         | 257/510 |

* cited by examiner

*Primary Examiner*—Zandra V. Smith
*Assistant Examiner*—Christy Novacek
(74) *Attorney, Agent, or Firm*—Myers Bigel Sibley & Sajovec (57) ABSTRACT

Methods of forming an electronic device including a substrate and a raised pattern on the substrate are provided. For example, a first insulating layer may be formed on the raised pattern and on the substrate. More particularly, forming the first insulating layer may include forming a first portion of the first insulating layer using a first processing condition and forming a second portion of the first insulating layer using a second processing condition. After forming the first insulating layer including the first and second portions, portions of the first insulating layer may be removed to expose portions of the raised pattern while maintaining portions of the first insulating layer on the substrate. After removing portions of the first insulating layer, a second insulating layer may be formed on the exposed portions of the raised pattern and on the maintained portions of the first insulating layer.

19 Claims, 9 Drawing Sheets

METHODS OF FORMING INTEGRATED CIRCUIT DEVICES INCLUDING INSULATION LAYERS

CROSS REFERENCE TO RELATED APPLICATION

This application claims the benefit of priority from Korean Patent Application No. 2003-9476 filed on Feb. 14, 2003, the disclosure of which is incorporated herein by reference in its entirety by reference.

FIELD OF THE INVENTION

The present invention relates to methods of forming integrated circuit devices. More particularly, the present invention relates to methods of forming insulation layers for integrated circuit devices.

BACKGROUND OF THE INVENTION

Designs of integrated circuit semiconductor devices have developed rapidly, particularly with increased use of information processing technologies. To meet various demands when using these information processing technologies, semiconductor devices may need to provide high response speeds and/or large storage capacities. Hence, semiconductor manufacturing technologies have been developed to provide semiconductor devices having high integration densities, improved reliability, rapid response speeds, etc.

As semiconductor devices become more highly integrated, a cell of a semiconductor device (such as a memory device) may be significantly reduced in size, resulting in reduction of processing margins and/or dimensions of patterns and/or wirings. Moreover, the patterns and/or wirings may have increased aspect ratios.

In a highly integrated semiconductor device, numerous patterns and/or wirings may be formed on a semiconductor substrate. Some patterns and/or wirings are insulated from one another while other patterns and/or wirings are electrically connected. For example, a very large scaled integrated (VLSI) circuit generally may have a multi-layered structure in which patterns and/or wirings are electrically connected.

As semiconductor devices have been manufactured with design rules of below about 0.1 µm, contact holes for connecting one pattern and/or wiring to another pattern and/or wiring may have minute sizes, and intervals between the patterns and/or wirings may be greatly reduced while aspect ratios may be increased. To provide processing margins when forming contact holes, self-aligned contact formation processes have been developed. In particular, spacers may be formed on sidewalls of the patterns and/or the wirings in a self-aligned contact formation process so that intervals between the patterns and/or the wirings may be reduced. When an insulation layer is formed to cover narrowly disposed patterns and/or the wirings, voids may be generated in the insulation layer because the intervals between the patterns and/or the wirings are too narrow and the design rule of the semiconductor device may be reduced. Bridges may thus be generated in the voids between the patterns and/or the wirings and may cause a failure of the semiconductor device as well as reduce throughput of a semiconductor manufacturing process.

U.S. Pat. No. 6,423,630 discusses forming an interlayer insulation layer on a semiconductor substrate where metal patterns having high aspect ratios are formed.

Figure 1A:
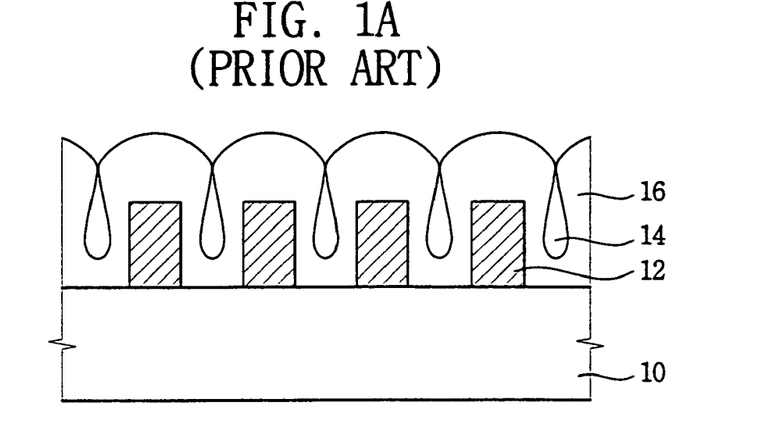
FIGS. 1A to 1C are cross sectional views illustrating a conventional method of forming an interlayer insulation layer on a substrate having metal patterns of high aspect ratios.
Figure 1B:
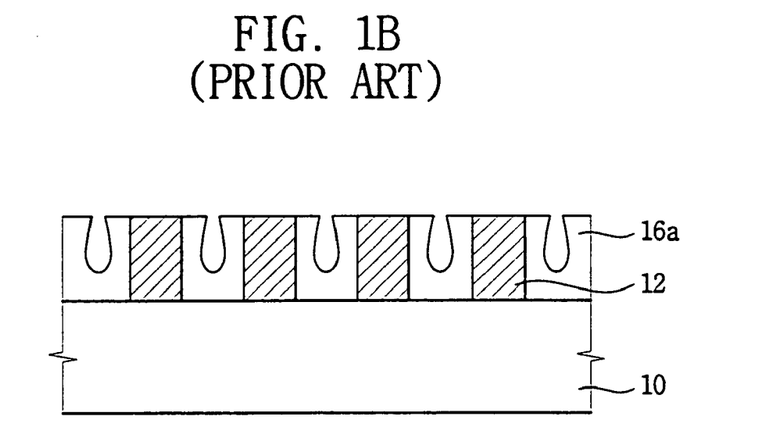
Figure 1C:
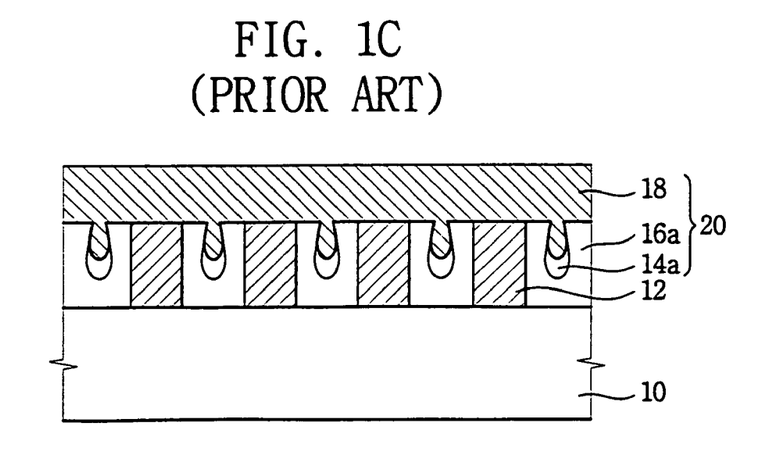

FIGS. 1A to 1C are cross sectional views illustrating a conventional method of forming an interlayer insulation layer on a substrate having metal patterns of high aspect ratios as disclosed in U.S. Pat. No. 6,423,630. The disclosure of U.S. Pat. No. 6,423,630 is incorporated herein by reference in its entirety.

Referring to FIG. 1A, metal patterns 12 are provided on a substrate 10. A first insulation material 16 is formed via a chemical vapor deposition (CVD) process on the substrate 10 and metal patterns 12. Because the first insulation layer 16 may not completely fill gaps between the metal patterns 12, voids 14 having long elliptical shapes may be formed in the first insulation layer 16.

As shown in FIG. 1B, the first insulation layer 16 may be partially removed by a chemical mechanical polishing (CMP) process, thereby forming first insulation layer patterns 16a that open the voids in the first insulation layer 16 and that expose upper faces of the metal patterns 12. Here, the voids 14 may be relatively narrow at their openings after the CMP process because wider portions of the voids may be more closely adjacent to the substrate 10.

Referring to FIG. 1C, a second insulation material may be formed on the first insulation layer patterns 16a by a CVD process to cover the narrowly opened voids. Thus, a second insulation layer 18 may be formed on the first insulation layer patterns 16a to thereby form a combined interlayer insulation layer on the substrate.

When the second insulation layer 18 is formed on the first insulation layer pattern 16a including the narrowly opened voids, however, the voids may not be completely filled with the second insulation layer 18. Bridges may thus be generated between the metal patterns 12 in a successive process. In addition, because the first insulation layer pattern 16a is formed using the CMP process, the metal patterns 12 may be damaged during the CMP process and the throughput of a semiconductor manufacturing process may be reduced.

SUMMARY OF THE INVENTION

According to embodiments of the present invention, methods may be provided for forming an electronic device including a substrate and a raised pattern on the substrate. In particular, a first insulating layer may be formed on the raised pattern and on the substrate wherein a first portion of the first insulating layer is formed using a first processing condition and a second portion of the first insulating layer is formed using a second processing condition. After forming the first insulating layer including the first and second portions, portions of the first insulating layer may be removed to expose portions of the raised pattern while maintaining portions of the first insulating layer on the substrate. After removing portions of the first insulating layer, a second insulating layer may be formed on the exposed portions of the raised pattern and on the maintained portions of the first insulating layer.

More particularly, the substrate may be a semiconductor substrate, the raised pattern may be a trench isolation pattern in the semiconductor substrate, and portions of the first insulating layer may be maintained in trenches defined by the trench isolation pattern. In an alternative, the substrate may be an integrated circuit substrate, the raised pattern may be a pattern of transistor gate electrodes, and portions of the first insulating layer may be maintained between transistor gate electrodes. In still another alternative, the substrate may be an integrated circuit substrate, the raised pattern may be a pattern of memory array bit lines, and portions of the first insulating layer may be maintained between memory array bit lines.

Moreover, the first insulating layer may include closed voids therein, and the voids may be opened after removing portions of the first insulating layer. The closed voids may be located in the first insulating layer between portions of the raised pattern, and the second insulating layer may fill the voids.

In addition, forming the first portion of the first insulating layer using the first processing condition may include forming the first portion of the first insulating layer using a first pressure, and forming the second portion of the first insulating layer using the second processing condition may include forming the second portion of the first insulating layer using a second pressure different than the first pressure. In addition or in an alternative, forming the first portion of the first insulating layer using the first processing condition may include forming the first portion of the first insulating layer using a first bias power, and forming the second portion of the first insulating layer using the second processing condition may include forming the second portion of the first insulating layer using a second bias power different than the first bias power.

For example, forming the first portion of the first insulating layer using the first processing condition may include forming the first portion of the first insulating layer using a pressure in the range of about 1 milliTorr to about 5 milliTorr and a bias power in the range of about 500 Watts to about 1500 Watts. Moreover, forming the first portion of the first insulating layer using the first processing condition may include using a processing gas including an oxygen gas at a flow rate in the range of about 30 sccm to about 150 sccm, a helium gas at a flow rate in the range of about 10 sccm to about 200 sccm, and a silane gas at a flow rate in the range of about 10 sccm to about 100 sccm. In addition, forming the second portion of the first insulating layer using the second processing condition may include forming the second portion of the first insulating layer using a pressure in the range of about 3 milliTorr to about 10 milliTorr and a bias power in the range of about 1000 Watts to about 5000 Watts. Forming the second portion of the first insulating layer using the second processing condition may also included using a processing gas including an oxygen gas at a flow rate in the range of about 30 sccm to about 150 sccm, a helium gas at a flow rate in the range of about 10 sccm to about 300 sccm, and a silane gas at a flow rate in the range of about 10 sccm to about 100 sccm.

The first insulating layer may be formed using a high density plasma chemical vapor deposition (HDP-CVD). Removing portions of the first insulating layer may include etching back portions of the first insulating layer without mechanical polishing while etching back. Removing portions of the first insulating layer may also include mechanical polishing separate from the etching back. More particularly, a wet and/or dry chemical etch back may be preceded by a separate step of chemical mechanical polishing (CMP).

Removing portions of the first insulating layer may include removing portions of the first insulating layer beyond portions of the raised pattern so that the raised pattern extends beyond the maintained portions of the first insulating layer and so that the maintained portions of the first insulating layer are recessed relative to the exposed portions of the raised pattern. In addition, a height of the first insulating layer between portions of the raised pattern may be greater than a height of the raised pattern before removing portions of the first insulating layer.

According to additional embodiments of the present invention, a first insulating layer may be formed on a raised pattern and on a substrate, and a height of the first insulating layer between portions of the raised pattern may be greater than a height of the raised pattern. After forming the first insulating layer, portions of the first insulating layer may be removed while maintaining portions of the first insulating layer so that the raised pattern extends beyond the maintained portions of the first insulating layer and so that the maintained portions of the first insulating layer are recessed between portions of the raised pattern. After removing portions of the first insulating layer, a second insulating layer may be formed on the exposed portions of the raised pattern and on the maintained portions of the first insulating layer.

In addition, forming the first insulating layer may include forming a first portion of the first insulating layer using a first processing condition and forming a second portion of the first insulating layer using a second processing condition. For example, the first portion of the first insulating layer may be formed using a first pressure, and the second portion of the first insulating layer may be formed using a second pressure different than the first pressure. In addition or in an alternative, the first portion of the first insulating layer may be formed using a first bias power, and the second portion of the first insulating layer may be formed using a second bias power different than the first bias power.

Moreover, removing portions of the first insulating layer may include etching back portions of the first insulating layer without mechanical polishing while etching back. Removing portions of the first insulating layer may also include mechanical polishing separate from etching back. More particularly, a wet and/or dry chemical etch back may be preceded by a separate step of chemical mechanical polishing (CMP).

The first insulating layer may include closed voids therein, and the voids may be opened after removing portions of the first insulating layer. Moreover, the closed voids may be located in the first insulating layer between portions of the raised pattern, and the second insulating layer may fill the voids.

More particularly, the substrate may be a semiconductor substrate, the raised pattern may be a trench isolation pattern, and portions of the first insulating layer may be maintained in trenches defined by the trench isolation pattern. In an alternative, the substrate may be an integrated circuit substrate, the raised pattern may be a pattern of transistor gate electrodes, and portions of the first insulating layer may be maintained between transistor gate electrodes. In yet another alternative, the substrate may be an integrated circuit substrate, the raised pattern may be a pattern of memory array bit lines, and portions of the first insulating layer may be maintained between memory array bit lines.

According to embodiments of the present invention, a method of forming an insulation layer in a semiconductor manufacturing process may be provided with reduced generation of voids in the insulation layer by varying processing conditions for forming high density plasma (HDP) oxides.

According to embodiments of the present invention, a first insulation material may be formed on a substrate including patterns formed thereon under a first processing condition. The first insulation material may have a maximum height over the patterns, and may include a void having a circular and/or an elliptical shape formed therein. A first insulation layer may be formed on the substrate including the patterns by forming a second insulation material on the first insulation material under a second processing condition varied from the first processing condition. The first insulation layer may have a level surface covering the patterns, and may include the voids formed therein. The first insulation layer may be etched by an etch back process to open the void in the first insulation layer, and to expose upper faces of the patterns after forming the first insulation layer. A second insulation layer may be formed on the etched first insulation layer to fill the opened void, and to cover the patterns after etching the first insulation layer.

In accordance with additional embodiments of the present invention, a substrate having patterns formed thereon is provided, and then a first insulation layer may be formed on the substrate to have a level surface and/or to cover the patterns via a formation of a first insulation material. Here, voids may be formed at portions of the first insulation layer between the patterns. First insulation layer patterns may be formed between the patterns by etching the first insulation layer using an etch back process. The first insulation layer patterns may include widely opened voids. A second insulation layer having a level surface may be formed on the first insulation layer patterns by forming a second insulation material. The second insulation layer may fill up the opened void and cover the patterns.

In accordance with still additional embodiments of the present invention, a substrate having conductive patterns may be provided, and a first insulation material may be formed on the substrate to cover the conductive patterns. More particularly, the first insulation material may be formed using a high density plasma chemical vapor deposition (HDP-CVD) process under a first processing condition including a first pressure and a first bias power. The first insulation material may have voids formed therein and a maximum height. A first insulation layer having a level surface may be formed on the substrate by forming a second insulation material on the first insulation material under a second processing condition including a second pressure and a second bias power. First insulation layer patterns may be formed between the conductive patterns by etching the first insulation layer using an etch back process. The first insulation layer patterns may widely open the voids. A second insulation layer is formed on the first insulation layer patterns via a formation of a third insulation material. The second insulation layer may fill up the opened voids and cover the conductive patterns.

According to yet additional embodiments of the present invention, an insulation layer including HDP oxide may be formed without voids by varying processing conditions so that the insulation layer (such as an oxide layer and/or an interlayer insulation layer) may be formed to completely cover conductive patterns having high aspect ratios such as gate structures and/or bit line structures. Also, the insulation layer may have a level surface over the patterns without generation of the voids. Additionally, bridges between conductive patterns may be reduced because the insulation layer having no voids may completely fill gaps between the conductive patterns such as gate structures and/or bit line structures. Failure of a semiconductor device due to bridging may thus be reduced and the yield of a semiconductor manufacturing process may be improved. Furthermore, an interlayer insulation layer according to embodiments of the present invention may be formed without a chemical mechanical polishing (CMP) process so that the throughput of the semiconductor manufacturing process may be improved.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like reference numerals refer to like elements throughout. In the drawings, the thickness of layers and regions are exaggerated for clarity. It will also be understood that when a layer is referred to as being on another layer or substrate, it can be directly on the other layer or substrate, or intervening layers may also be present. When a layer is referred to as being directly on another layer of substrate, no intervening layers are present.

Embodiments of the present invention may provide methods of forming an insulation layer such as a isolation layer in a trench and/or an interlayer insulation layer for insulating conductive patterns using an HDP oxide with reduced generation of voids therein.

When an insulation layer is formed on a substrate having patterns formed thereon using HDP oxide, the insulation layer may have voids between the patterns, and the insulation layer may have a stepped surface over the patterns because the HDP oxide may be relatively hard. To reduce the voids formed in the insulation layer, a CMP process may be performed on the insulation layer to open the voids. When the voids are opened after the CMP process, however, the voids may be adjacent to the surface of the substrate and the voids may be narrow at their openings because the voids have circular or elliptical shapes. These narrowly opened voids may not be completely filled with an additional HDP oxide successively formed to complete the insulation layer.

According to embodiments of the present invention, a first insulation layer having a maximum height may be formed on a substrate having patterns formed thereon using a first HDP oxide by a high density plasma chemical vapor deposition (HDP-CVD) process. Here, voids may be formed in portions of the first insulation layer between the patterns.

The first HDP oxide may be deposited under a first processing condition including a relatively low pressure and a relatively low bias power. More particularly, the first processing condition may include a pressure in the range of about 1 milliTorr to about 5 milliTorr, and a bias power in the range of about 500 W to about 1,500 W. In particular, the pressure may be in the range of about 1 milliTorr to about 3 milliTorr, and the bias power may be in the range of about 700 W to about 1,200 W. In addition, the first HDP oxide may be formed using a first processing gas including an oxygen ($O_2$) gas, a helium (He) gas, and a silane ($SiH_4$) gas in respective flow rate ratios of about 30 to about 150, about 10 to about 200, and about 10 to about 100.

Then, a second HDP oxide may be deposited on the first HDP oxide to complete the first insulation layer by an HDP-CVD process under a second processing condition varied from the first processing condition. The second HDP oxide may be formed using a second processing gas including an oxygen ($O_2$) gas, a helium (He) gas, and a silane ($SiH_4$) gas in respective flow rate ratios of about 30 to about 150, about 10 to about 300, and about 10 to about 100. The second processing condition may include a relative high pressure in the range of about 3 milliTorr to about 7 milliTorr and a relatively high bias power in the range of about 1,000 W to about 5,000 W. Because the second HDP oxide is deposited under the second processing condition including the pressure and the bias power relatively higher than those of the first processing condition, the voids may have circular and/or elliptical shapes. Moreover, the HDP oxides may be more sputtered during the HDP-CVD processes so that the first insulation layer may have a level surface over the patterns formed on the substrate. In addition, the circular and/or elliptical shaped voids in the first insulation layer may be positioned over the substrate between the patterns.

After the first insulation layer is etched using an etch back process without a CMP process, the voids having the circular and/or elliptical shapes may be widely opened. For example, the widely opened voids may have openings at least as wide as lower portions of the opened voids. During the etch back process, overhang structures of the first insulation layer over the voids may be removed to widely open the voids and expose the patterns on the substrate. The etch back process may be performed as a wet etching process and/or a dry etching process. A second insulation layer may be formed on the etched first insulation process using a third HDP oxide under a third processing condition. Here, the third HDP oxide and the third processing condition may be substantially identical to the second HDP oxide and the second processing condition, respectively. Thus, an insulation layer including the second insulation layer and the etched first insulation layer may be formed on the substrate to cover the patterns. As a result, the insulation layer may have a level surface and no voids even though the patterns have high aspect ratios.

Figure 2:
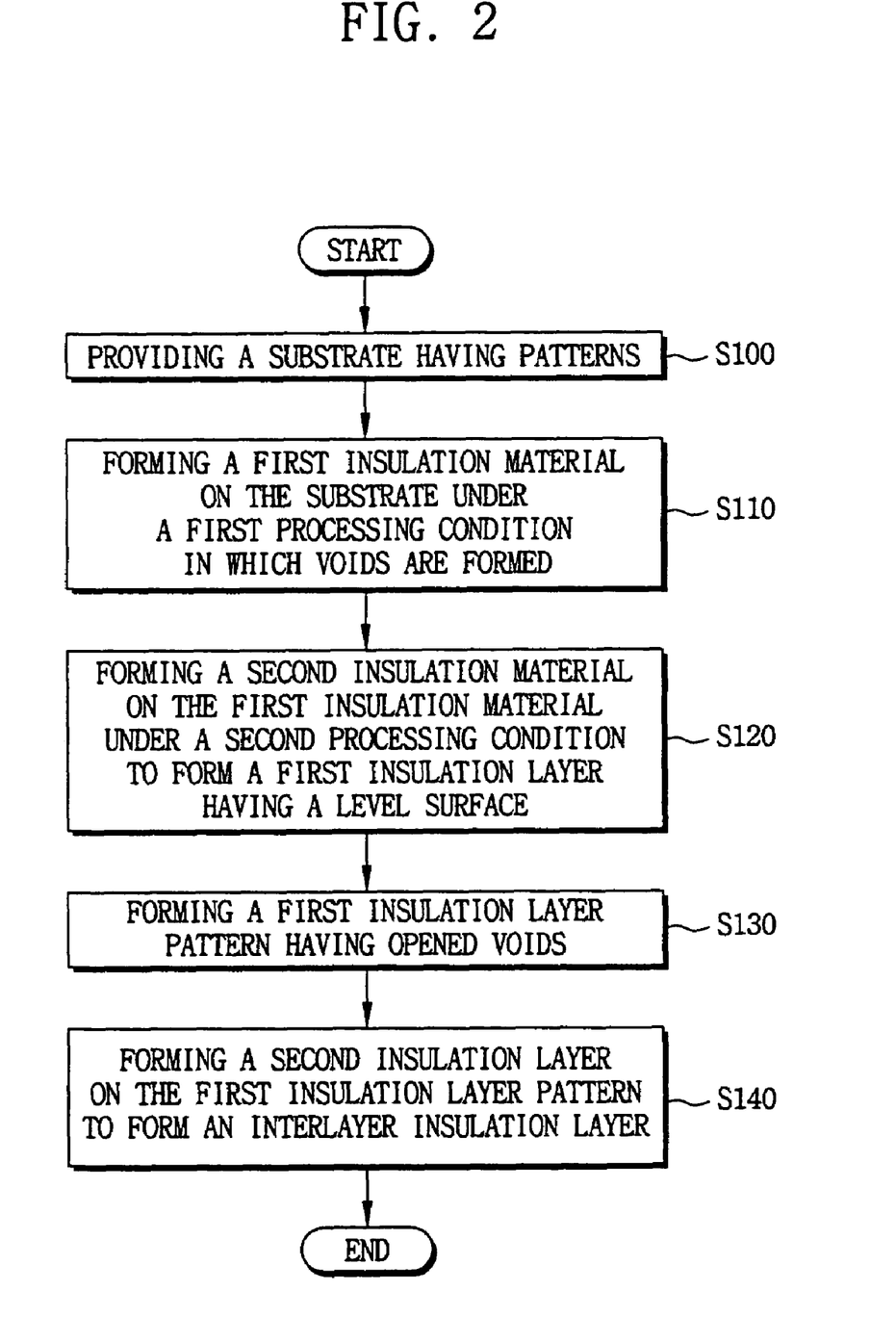
FIG. 2 is a flow chart illustrating methods of forming an insulation layer on a semiconductor substrate including patterns having high aspect ratios according to embodiments of the present invention.

FIG. 2 is a flow chart illustrating methods of forming an insulation layer on a semiconductor substrate including patterns having high aspect ratios according to embodiments of the present invention.

Referring to FIG. 2, a substrate including patterns having high aspect ratios is provided at block S100. The patterns may include trenches formed in the substrate, gate structures formed on the substrate and/or bit line structures formed over the substrate.

At block S110, a first insulation material may be formed on the substrate to cover the patterns using, for example, an HDP-CVD process. The first insulation material may have a maximum height over the substrate, and voids may be generated in the first insulation material. The first insulation material may be formed under a first processing condition including a first pressure and a first bias power. When the first pressure is lower than about 1 milliTorr and/or the first bias power is lower than about 500 W, a processing time for forming the first insulation material may be increased to thereby reduce a throughput of a semiconductor manufacturing process. In addition, when the first pressure is higher than about 5 milliTorr and/or the first bias power is higher than about 1,500 W, overhang structures causing the formation of the voids may be generated too rapidly in the first insulation material and the voids may be closely adjacent to the substrate. Accordingly, the first pressure may be in the range of about 1 milliTorr to about 5 milliTorr and the first bias power may be in the range of about 500 W to about 1,500 W. More particularly, the first pressure may be in the range of about 1 milliTorr to about 3 milliTorr and the first bias power may be in the range of about 700 W to about 1,200 W. The first insulation material may be formed using a first processing gas including an $O_2$ at a flow rate in the range of about 30 sccm to about 150 sccm, an He gas at flow rate in the range of about 10 sccm to about 200 sccm, and an $SiH_4$ gas at a flow rate in the range of about 10 sccm to about 100 sccm.

As described above, since the first insulation material is formed at a relatively low pressure and relative low bias power, the overhang structures may be generated slowly in the first insulation material and the first insulation material may have the maximum height over the patterns having the high aspect ratios.

At block S120, a second insulation material may be formed on the first insulation material using an HDP-CVD process under a second processing condition to thereby form a first insulation layer having a level surface on the substrate. The second insulation material may be formed at a relatively high second pressure and a relative high second bias power.

When the second pressure is lower than about 3 milliTorr and the second bias power is lower than about 1,000 W, voids having relatively long elliptical shapes may be formed in the first insulation layer, and the first insulation layer may have high stepped portions over the patterns. Accordingly, an additional CMP process may be performed on the first insulation layer after the first insulation layer is etched by an etch back process to further open the voids.

When the second pressure is higher than about 10 milliTorr and/or the second bias power is higher than about 5,000 W, the insulation materials may be exceedingly sputtered during the HDP-CVD processes, which may deteriorate qualities of the first insulation layer. Therefore, the second insulation material may be formed at a pressure in the range of about 3 milliTorr to about 10 milliTorr and a bias power in the range of about 1,000 W to about 5,000 W. More particularly, the second insulation material may be formed at a pressure in the range of about 3 milliTorr to about 7 milliTorr and a bias power in the range of about 2,000 W to about 4,000 W. Additionally, the second insulation material may be formed using a second processing gas including an $O_2$ at a flow rate in the rate of about 30 sccm to about 150 sccm, an He gas at a flow rate in the range of about 10 sccm to about 300 sccm, and an $SiH_4$ gas at a flow rate in the range of about 10 sccm to about 100 sccm.

At block S130, the first insulation layer including the circular and/or elliptical shaped voids may be etched using an etch back process to form a first insulation layer pattern including relatively widely opened voids between the patterns. In the etch back process, the overhang structures of the first insulation layer may be removed or reduced so that the voids are widely opened. The etch back process may be performed as a wet etching process and/or a dry etching process.

At block S140, a second insulation layer including a third insulation material may be formed on the first insulation layer pattern using an HDP-CVD process to form an interlayer insulation layer on the substrate. The second insulation layer may completely cover and fill the opened voids and cover the patterns having the high aspect ratios. Here, the third insulation material may be substantially identical to the second insulation material. In addition, a third processing condition for the third insulation material may include a third pressure and a third bias power substantially identical to the second processing condition.

When the third pressure is lower than about 3 milliTorr and/or the third bias power is lower than about 1,000 W, the second insulation layer may have stepped portions that are too high over the patterns. When the third pressure is higher than about 10 milliTorr and/or the third bias power is higher than about 5,000 W, the third insulation material may be disadvantageously sputtered during the HDP-CVD process, which may deteriorate qualities of the second insulation layer. The second insulation layer may thus be formed using the third processing condition including the third pressure in the range of about 3 milliTorr to about 10 milliTorr and the third bias power in the range of about 1,000 W to about 5,000 W. More particularly, the second insulation layer may be formed using a third processing condition including a third pressure in the range of about 3 milliTorr to about 7 milliTorr and a third bias power in the range of about 2,000 W to about 4,000 W. Additionally, the second insulation layer may be formed using a third processing gas (which may be substantially identical to the second processing gas) including an $O_2$ at a flow rate in the range of about 30 sccm to about 150 sccm, an He gas at a flow rate in the range of about 10 sccm to about 300 sccm, and an $SiH_4$ gas at a flow rate in the range of about 10 sccm to about 100 sccm. As a result, the interlayer insulation layer may be formed on the substrate to have a level surface covering the patterns having the high aspect ratios and/or having reduced voids therein.

FIGS. 3A to 3E are cross sectional views illustrating methods of forming an insulation layer used in a shallow trench isolation process according to embodiments of the present invention. The insulation layer, for example, may be used to define active and field regions in an integrated circuit memory device such as a dynamic random access memory device.

Figure 3A:
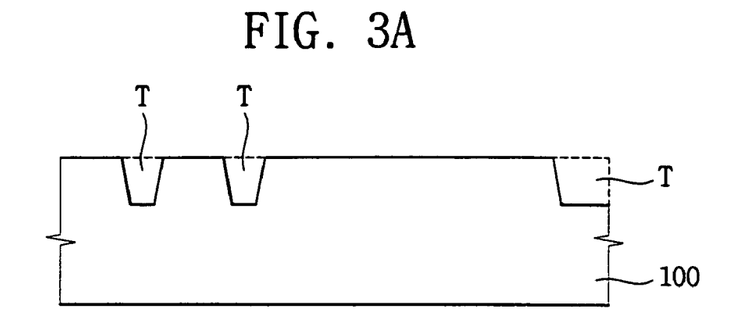
FIGS. 3A to 3E are cross sectional views illustrating methods of forming an insulation layer in a shallow trench isolation process in accordance with embodiments of the present invention.

Referring to FIG. 3A, to execute a shallow trench isolation (STI) process using a semiconductor substrate 100 including silicon, a plurality of trenches T may be formed on the semiconductor substrate 100.

Figure 3B:
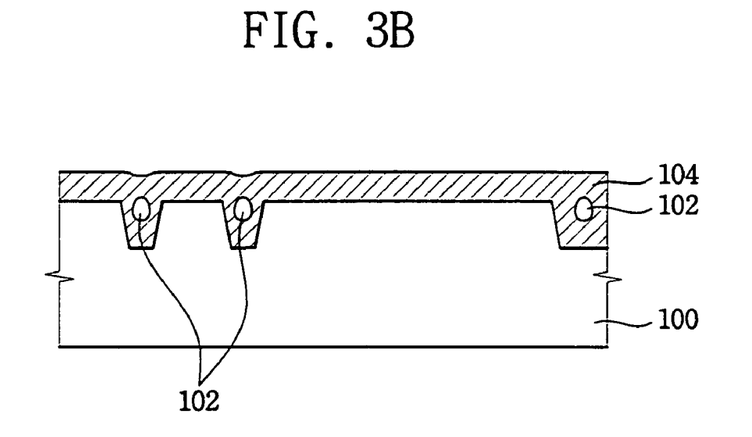

Referring to FIG. 3B, a first HDP oxide layer 104 may be formed using first and second HDP oxide depositions. A first high density plasma (HDP) oxide may be formed on the semiconductor substrate 100 having the trenches T. The first HDP oxide may be formed using a high density plasma chemical vapor deposition (HDP-CVD) process using a first processing condition including a pressure of about 2 milliTorr and a bias power of about 1,000 W. Hence, the first HDP oxide may be formed to fill the trenches T while voids 102 may be formed in the trenches T. Here, the first HDP oxide may be formed using a first processing gas that includes an oxygen $O_2$ at a flow rate of about 60 sccm, a helium He gas at a flow rate of about 90 sccm, and a silane $SiH_4$ gas at a flow rate of about 50 sccm under the first processing condition.

A second HDP oxide may be formed on the first HDP oxide under a second processing condition including a pressure of about 5 milliTorr and a bias power of about 3,500 W to complete the first HDP oxide layer 104 including the first and second HDP oxides. The second HDP oxide may be formed using a second processing gas including an $O_2$ at a flow rate of about 60 sccm, an He gas at a flow rate of about 200 sccm, and an $SiH_4$ gas at a flow rate of about 25 sccm. Thus, a first HDP oxide layer 104 including the first and second HDP oxides may be formed on the substrate 100 to fill the trenches T. The first HDP oxide layer 104 may include the voids 102 having circular and/or elliptical shapes, and the first HDP oxide layer 104 may have a level surface.

Figure 3C:
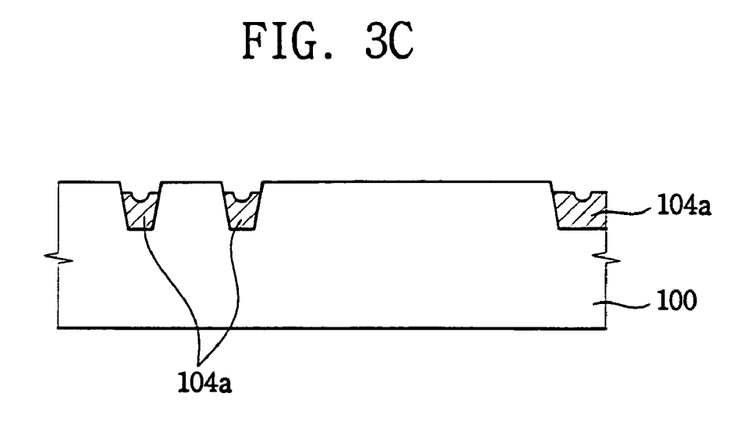

Referring to FIG. 3C, the first HDP layer 104 including voids 102 therein may be etched using an etch back process. Thus, the substrate 100 may be exposed, and first HDP oxide layer patterns 104a may be formed in the trenches T. The first HDP oxide layer patterns 104a may thus have opened voids thereon after the etching of the first HDP oxide layer 104. Here, the etch back process can reduce and/or remove overhang structures of the first HDP oxide to thereby widely open upper portions of the voids 102. In particular, the etch back process may be performed as a wet etching process.

Figure 3D:
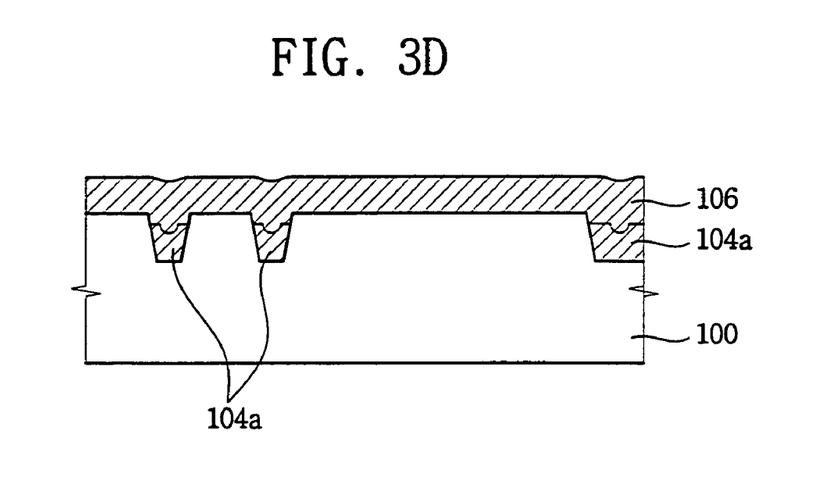
Figure 3E:
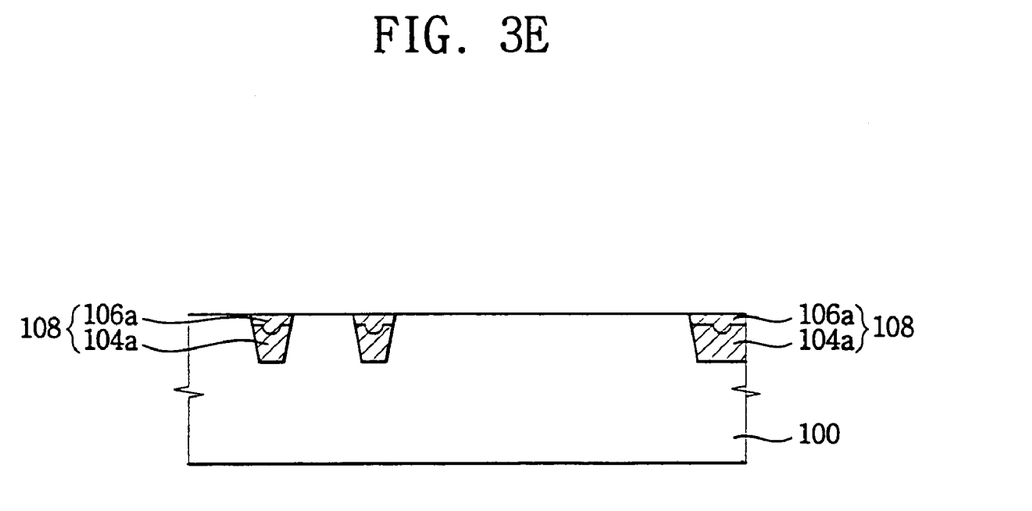

Referring to FIGS. 3D and 3E, a third HDP oxide may be formed on the first HDP oxide layer patterns 104a and on the substrate 100 so that a second HDP oxide layer 106 is formed on the first HDP oxide layer patterns 104a and on the substrate 100. Here, the second HDP oxide layer 106 may be formed using an HDP-CVD process using third processing conditions including a pressure of about 5 milliTorr and a bias power of about 3,500 W. The third processing conditions may be substantially identical to the second processing conditions. The opened voids of the first HDP oxide layer patterns 104a may be covered and/or filled with the second HDP oxide layer 106. The opened voids may thus be filled with the second HDP oxide layer 106.

Portions of the second HDP oxide layer 106 may be removed using a CMP process until the substrate 100 is exposed, thereby forming a third HDP oxide layer 108 in the trenches T, as shown in FIG. 3C. The third HDP oxide layer 108 includes the first HDP oxide layer pattern 104a and a second HDP oxide layer pattern 106a. As a result, voids in the third HDP oxide layer 108 may be reduced, and the third HDP oxide layer may serve as an isolation layer that divides the substrate 100 into active region and field regions.

FIGS. 4A to 4E are cross sectional views illustrating methods of forming an interlayer insulation layer on a semiconductor substrate having gate structures formed thereon in accordance with other embodiments of the present invention. The gate structures, for example, may be gate structures for memory cell access transistors for a memory device such as a dynamic random access memory device.

Figure 4A:
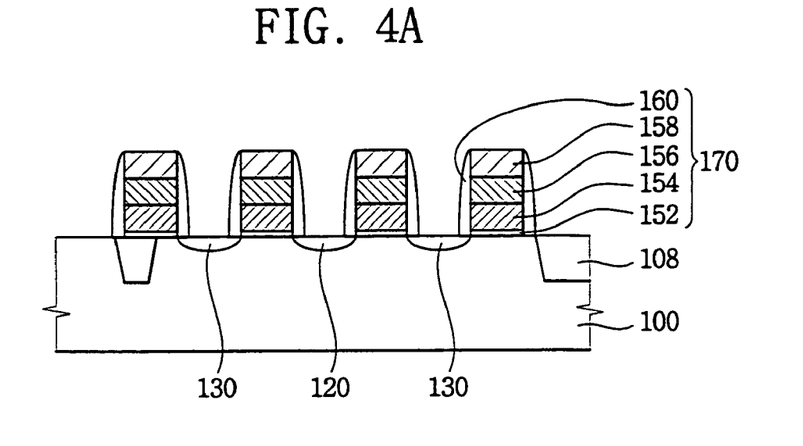
FIGS. 4A to 4E are cross sectional views illustrating methods of forming an interlayer insulation layer on a semiconductor substrate having gate structures formed thereon in accordance with embodiments of the present invention.

Referring to FIG. 4A, a plurality of gate structures 170 may be formed on a semiconductor substrate 100 including an isolation layer 108 that divides the substrate 100 into active and field regions. Each of the gate structures 170 may include a gate electrode and a gate spacer 160. More particularly, a gate oxide layer, a polysilicon layer, a metal silicide layer, and a silicon nitride layer may be successively formed on the substrate 100. After a photoresist pattern is formed on the silicon nitride layer to define layouts of the gate electrodes, the silicon nitride layer may be etched to form a gate mask 158 using the photoresist pattern as an etching mask. The metal silicide layer, the polysilicon layer and the gate oxide layer can be sequentially etched using the gate mask 158 as an etching mask to thereby form a metal silicide layer pattern 156, a polysilicon layer pattern 154, and a gate oxide layer pattern 152 on the substrate 100. Thus, the gate electrode may be provided on the substrate 100.

Using the gate structures 170 as masks, impurities may be implanted into portions of the substrate 100 between the gate structures 170 using an ion implantation process so that source/drain regions 120 and 130 are formed on the substrate 100. After a nitride film is formed on the gate structures 170 and on the substrate 100, the nitride film may be etched to form the gate spacers 160 on sidewalls of the gate structures 170, thereby completing the gate structures 170 on the substrate 100.

Figure 4B:
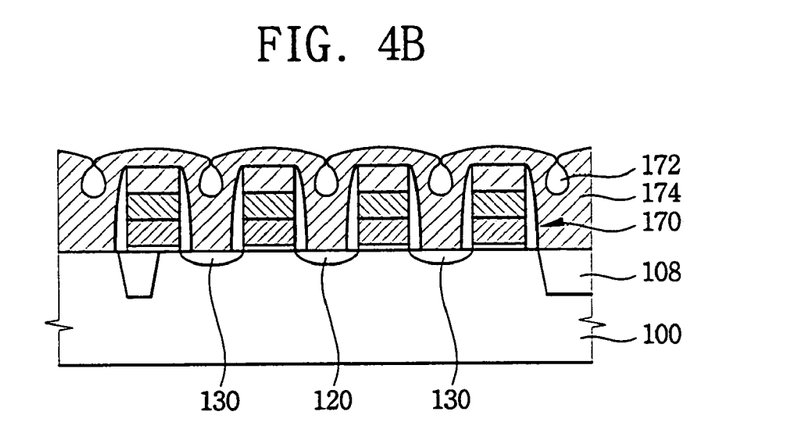
Figure 4C:
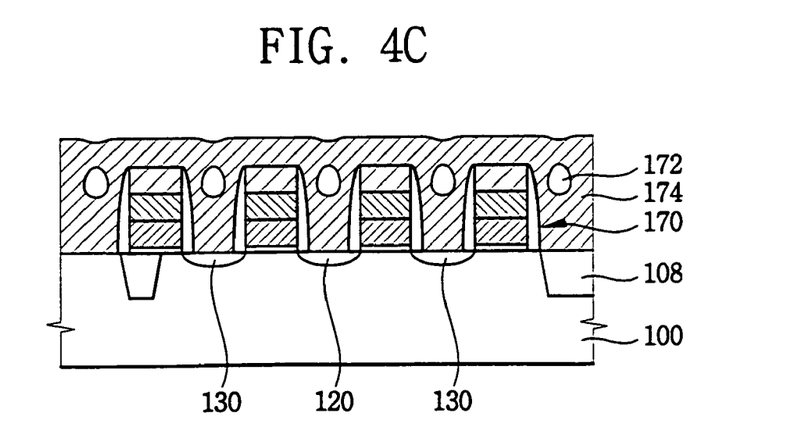

Referring to FIGS. 4B and 4C, a first HDP oxide may be formed on the substrate 100 having the gate structures 170 formed thereon. The first HDP oxide may be formed using an HDP-CVD process under a first processing condition including a pressure of about 2 milliTorr and a bias power of about 1,000 W. The first HDP oxide may be formed using a first processing gas including an $O_2$ at a flow rate of about 60 sccm, an He gas at a flow rate of about 90 sccm, and an $SiH_4$ gas at a flow rate of about 50 sccm. Hence, a first HDP oxide layer 174 including the first HDP oxide may be formed on the substrate 100 to cover the gate structures 170. Here, voids 172 may be generated particularly in portions of the first HDP oxide between the gate structures 170. Because the first HDP oxide layer 174 is formed using the HDP-CVD process under the first processing condition, the first HDP oxide layer 174 can have a selected maximum height over the source/drain regions 120 and 130 between the gate structures 170 where the voids 172 may be formed in the first HDP oxide layer 174.

The first processing condition may be changed to a second processing condition to form a second HDP oxide on the first HDP oxide, for example, using a HDP-CVD process. More particularly, the second HDP oxide may be formed using a second processing condition including a pressure of about 5 milliTorr and a bias power of about 3,500 W. The first HDP oxide layer 174 may thus include the first and second HDP oxides, and the first HDP oxide layer may have voids 172 therein. Moreover, the first HDP oxide layer may be provided on the substrate 100 to cover the gate structures 170. Here, the second HDP oxide may be formed using a second processing gas including an $O_2$ at a flow rate of about 60 sccm, an He gas at a flow rate of about 200 sccm, and an $SiH_4$ gas at a flow rate of about 25 sccm. The first HDP oxide layer 174 may include the voids 172 having circular and/or elliptical shapes, and may have a level surface covering the gate structures 170.

If the HDP oxide layer 174 is completed only under the first processing condition without changing the processing conditions, the voids 172 may have relatively large aspect ratios and long elliptical shapes formed in the first HDP oxide layer 174 due to characteristics of the first HDP oxide. In addition, if the HDP oxide layer 174 is completed only using the first processing condition, the first HDP oxide layer 174 may have high stepped portions adjacent to the gate structures 170 because the first HDP oxide may be relatively hard. As a result, an additional CMP process may be performed to remove stepped portions of the first HDP oxide layer 174 remaining on the gate structures 170 after an etch back process is carried out to open the voids 172 formed in the first HDP oxide layer 174.

As the first HDP oxide layer 174 is formed using the two HDP-CVD processes, the HDP oxides may be partially deposited on the substrate 100 and partially sputtered from the substrate 100. Thus, when the first HDP oxide layer 174 is formed from two HDP oxides by changing the first processing condition to the second processing condition, the sputtered amount of the HDP oxides may be augmented to thereby form the first HDP oxide layer 174 having the level surface and a selected maximum height over the gate structures 170.

Figure 4D:
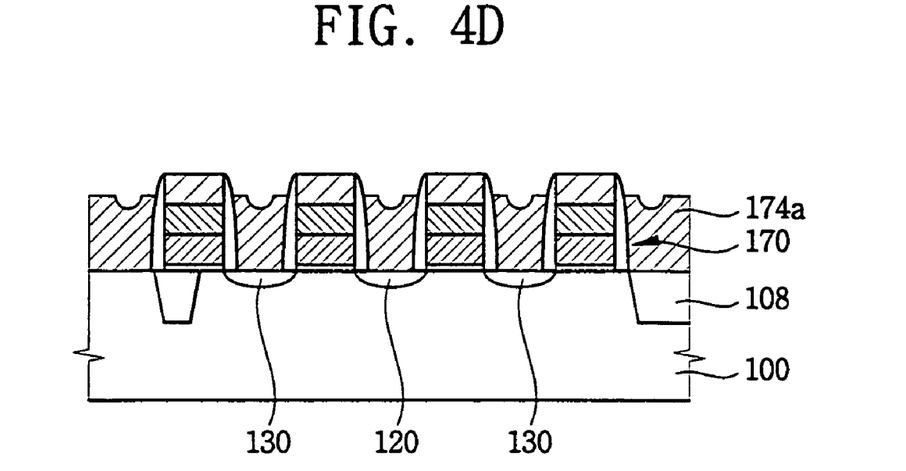

Referring to FIG. 4D, an etch back process can be performed on the first HDP oxide layer 174 including the voids 172 of the circular and/or elliptical shapes to expose the upper faces of the gate structures 170 and to open the voids 172. As a result, a first HDP oxide layer pattern 174a may be formed on the portions of the substrate 100 between the gate structures 170. In the etch back process, overhang structures of the first HDP oxide layer 174 on the voids 172 may be reduced and/or removed so that the voids 172 are widely opened after the etch back process. This etch back process may be performed as a wet etching process and/or a dry etching process.

Figure 4E:
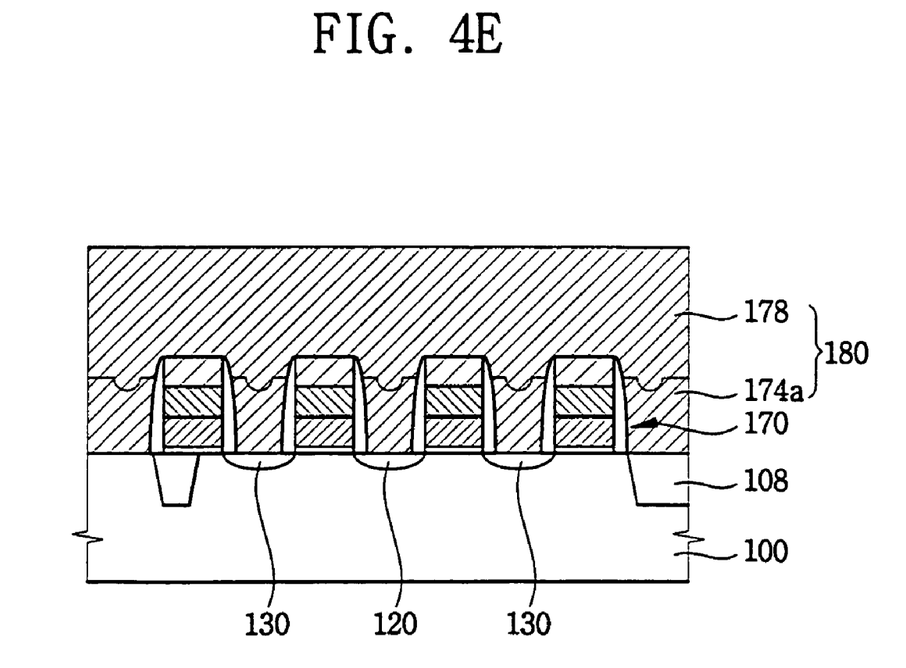

Referring to FIG. 4E, a third HDP oxide may be formed on the first HDP oxide layer pattern 174a using an HDP-CVD process to fill the opened voids 172 between the gate structures 170. In addition, the third HDP oxide may cover the gate structures 170 to form a second HDP oxide layer 178. Here, the second HDP oxide layer 178 may be formed under a third processing condition substantially identical to the second processing condition. That is, the second HDP oxide layer 178 may be formed at a pressure of about 5 milliTorr and a bias power of about 3,500 W. Therefore, an interlayer insulation layer 180 including the first HDP oxide layer pattern 174a and the second HDP oxide layer 178 may be formed on the substrate 100 to cover the gate structures 170. As described above, the interlayer insulation layer 180 may be formed substantially without voids because the opened voids 172 may be completely covered and/or filled with the third HDP oxide.

FIGS. 5A to 5E are cross sectional views illustrating methods of forming an interlayer insulation layer covering bit line structures formed over a semiconductor substrate according to still other embodiments of the present invention. The bit line structures, for example, may be bit lines for an integrated circuit memory device such as a dynamic random access memory device.

Figure 5A:
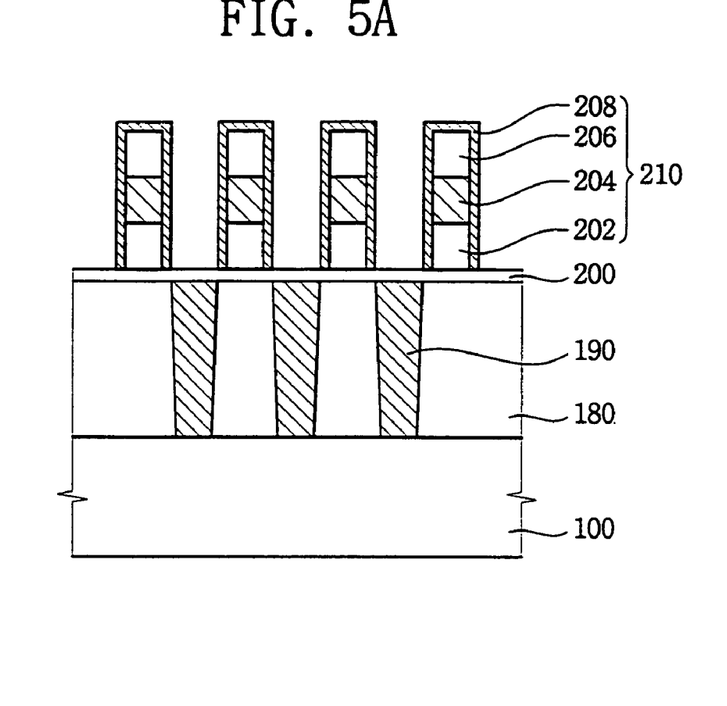
FIGS. 5A to 5E are cross sectional views illustrating methods of forming an interlayer insulation layer covering bit line structures formed over a semiconductor substrate according to embodiments of the present invention.

Referring to FIG. 5A, a first interlayer insulation layer 180 may be formed on a semiconductor substrate 100. Conductive pads 190 electrically contacting contact regions of the substrate 100 may be formed through portions of the first interlayer insulation layer 180 between gate structures.

After a second interlayer insulation layer 200 is formed on the first interlayer insulation layer 180, a plurality of bit line structures 210 may be formed on the second interlayer insulation layer 200. To form the bit line structures 210, a tungsten layer, a tungsten silicide layer and a silicon nitride layer may be successively formed on the second interlayer insulation layer 200. The silicon nitride layer, the tungsten silicide layer and the tungsten layer may than be sequentially patterned using a photoresist pattern as an etching mask to thereby form bit line electrodes including silicon nitride layer patterns 206, tungsten silicide layer patterns 204, and tungsten layer patterns 202 on the second interlayer insulation layer 200. After a nitride layer having a uniform thickness is formed on the second interlayer insulation layer 200 to cover the bit line electrodes, the nitride layer may be etched to form spacers 208 enclosing the bit line electrodes, thereby completing the bit line structures 210 on the second interlayer insulation layer 200.

Figure 5B:
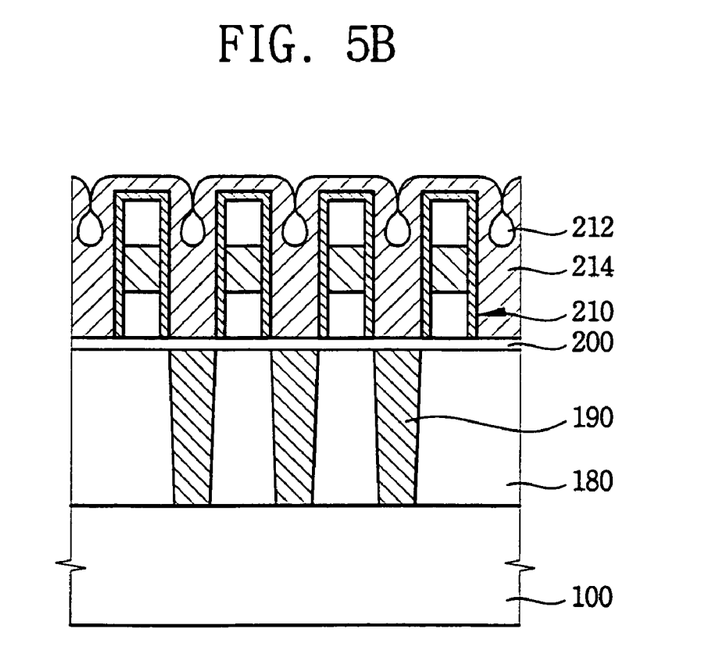
Figure 5C:
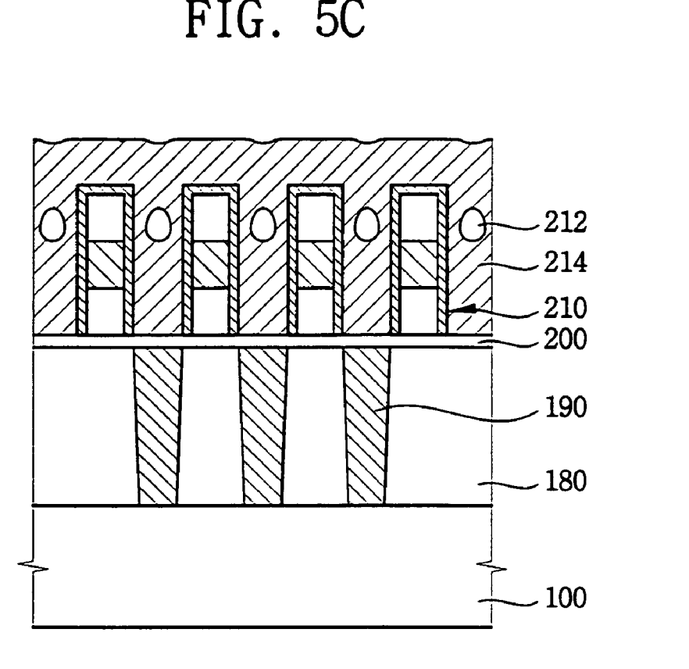

Referring to FIGS. 5B and 5C, a first HDP oxide layer 214 may be formed by forming two HDP oxides using different processing conditions. A first HDP oxide may be formed on the second interlayer insulation layer 200 to cover the bit line structures 210 using, for example, an HDP-CVD process. The first HDP oxide may be formed using a first processing condition including a pressure of about 2 milliTorr and a bias power of about 1,000 W. During formation of the first HDP oxide, voids 212 may be generated in the first HDP oxide because of characteristics of the first HDP oxide. Thus, a first HDP oxide layer 214 including the first HDP oxide may have a selected maximum height over the bit line structures 210 from the second interlayer insulation layer 200 while the voids 212 may be formed at portions of the first HDP oxide layer 214 between the bit line structures 210. The first HDP oxide may be formed using a first processing gas including an $O_2$ at a flow rate of about 60 sccm, an He gas at a flow rate of about 90 sccm, and an $SiH_4$ gas at a flow rate of about 50 sccm.

A second HDP oxide may be formed on the first HDP oxide using, for example, an HDP-CVD process under a second processing condition varied from the first processing condition to complete the first HDP oxide layer 214. The second HDP oxide may be formed at a pressure of about 5 milliTorr and a bias power of about 3,500 W. As a result, the first HDP oxide layer 214 may have a level surface, and may include the voids 212 having circular and/or elliptical shapes formed therein. The second HDP oxide may be formed using a second processing gas including an $O_2$ at a flow rate of about 60 sccm, an He gas at a flow rate of about 200 sccm, and an $SiH_4$ gas at a flow rate of about 25 sccm.

Figure 5D:
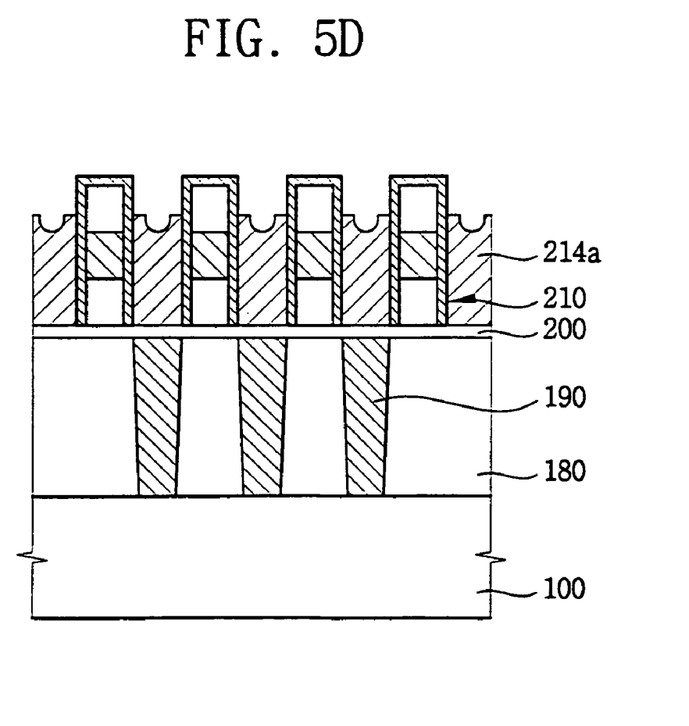

Referring to FIG. 5D, the first HDP oxide layer 214 including the circular and/or elliptical voids 212 may be etched using an etch back process to expose upper faces of the bit line structures 210 and to open the voids 212. Thus, first HDP oxide layer patterns 214a including the opened voids 212 may be formed between the bit line structures 210. In the etch back process for forming the first HDP oxide layer patterns 214a including the opened voids 212 between the bit line structures 210, overhang structures of the first HDP oxide layer 214 over the voids 212 may be reduced and/or removed to thereby widely open the voids 212. The etch back process may be performed, for example, as a wet etching process and/or a dry etching process.

Figure 5E:
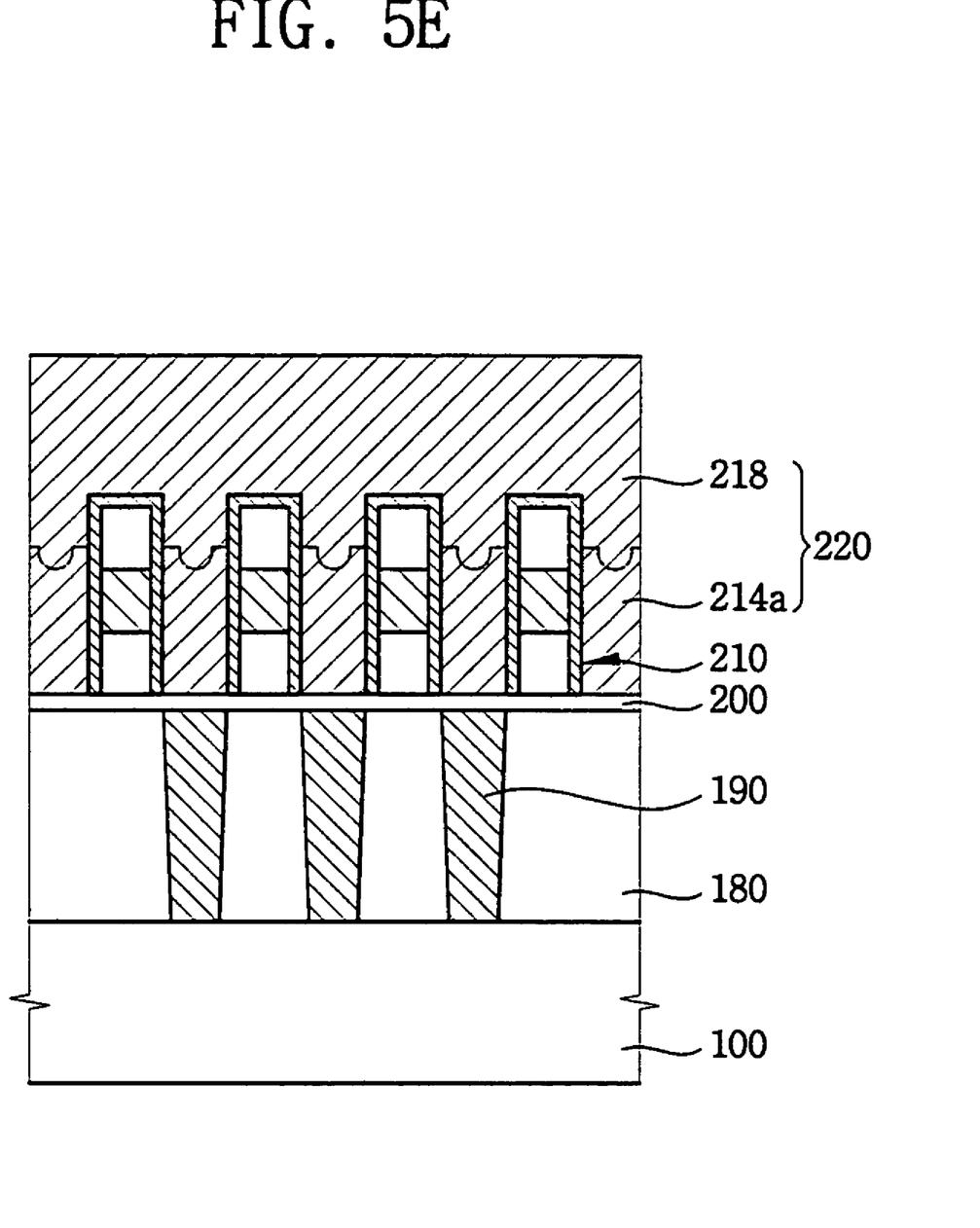

Referring to FIG. 5E, a third HDP oxide may be formed on the first HDP oxide layer pattern 214a using an HDP-CVD process to form a second HDP oxide layer 218 that completely covers and/or fills the opened voids 212. The second HDP oxide layer 218 may be formed under a third processing condition substantially identical to the second processing condition. That is, the second HDP oxide layer 218 may be formed at a pressure of about 5 milliTorr and a bias power of about 3,500 W.

When a third interlayer insulation layer 220 including the first HDP oxide layer pattern 214a and the second HDP oxide layer 218 is formed on the second interlayer insulation layer 200 to cover the bit line structures 210, voids in the third interlayer insulation layer 220 may be reduced and/or eliminated as described above.

According to embodiments of the present invention, an insulation layer including HDP oxide may be formed with reduced voids by varying processing conditions so that the insulation layer such as an oxide layer or an interlayer insulation layer is formed to completely cover conductive patterns formed on a substrate such as gate structures and/or bit line structures. Also, the insulation layer may have a level surface over the patterns with reduced generation of voids.

Additionally, generation of bridges between conductive patterns may be reduced because the insulation layer having reduced voids may completely fill gaps between the conductive patterns such as the gate structures and/or the bit line structures. Therefore, the failure of a semiconductor device due to bridging may be reduced and the yield of a semiconductor manufacturing process may be improved.

Furthermore, an interlayer insulation layer according to embodiments of the present invention may be formed without a CMP process so that throughput of the semiconductor manufacturing process may be enhanced.

While the present invention has been described by way of example and in terms of the particular embodiments, it is to be understood that the invention is not limited to the disclosed embodiments. To the contrary, it is intended to cover various modifications, and similar arrangements would be apparent to those skilled in the art. Therefore, the scope of the appended claims, which define the invention should be accorded the broadest interpretation so as to encompass all such modifications and similar structures.

That which is claimed is:

1. A method of forming an electronic device including a substrate and a raised pattern on the substrate, the method comprising:
    forming a first insulating layer on the raised pattern and on the substrate wherein forming the first insulating layer comprises forming a first portion of the first insulating layer using a first processing condition and forming a second portion of the first insulating layer using a second processing condition;
    after forming the first insulating layer including the first and second portions, removing portions of the first insulating layer to expose portions of the raised pattern while maintaining portions of the first insulating layer on the substrate; and
    after removing portions of the first insulating layer, forming a second insulating layer on the exposed portions of the raised pattern and on the maintained portions of the first insulating layer;
    wherein the first insulating layer includes closed voids therein, and wherein removing portions of the first insulating layer comprises opening the voids in the first insulating layer, and wherein openings in the voids are substantially at least as wide as any portions of the opened voids between the openings and the substrate;
    wherein the substrate comprises an integrated circuit substrate, wherein the raised pattern comprises a pattern of memory array bit lines, and wherein maintaining portions of the first insulating layer on the substrate comprises maintaining portions of the first insulating layer between memory array bit lines.

2. The method according to claim 1, wherein the substrate comprises an integrated circuit substrate, wherein the raised pattern comprises a pattern of transistor gate electrodes, and wherein maintaining portions of the first insulating layer on the substrate comprises maintaining portions of the first insulating layer between transistor gate electrodes.

3. The method according to claim 1, wherein the closed voids are located in the first insulating layer between portions of the raised pattern.

4. The method according to claim 1, wherein the second insulating layer fills the opened voids.

5. The method according to claim 1, wherein:
    forming the second portion of the first insulating layer using the second processing condition comprises forming the second portion of the first insulating layer using a pressure in the range of about 3 milliTorr to about 10 milliTorr and a bias power in the range of about 1000 Watts to about 5000 Watts.

6. The method according to claim 5, wherein forming the second portion of the first insulating layer using the second processing condition comprises using a processing gas including an oxygen gas at a flow rate in the range of about 30 sccm to about 150 sccm, a helium gas at a flow rate in the range of about 10 sccm to about 300 sccm, and a silane gas at a flow rate in the range of about 10 sccm to about 100 sccm.

7. The method according to claim 1, wherein forming the first insulating layer comprises forming the first insulating layer using a high density plasma chemical vapor deposition (HDP-CVD).

8. The method according to claim 1, wherein removing portions of the first insulating layer comprises removing portions of the first insulating layer beyond portions of the raised pattern so that the raised pattern extends beyond the maintained portions of the first insulating layer and so that the maintained portions of the first insulating layer are recessed relative to the exposed portions of the raised pattern.

9. The method according to claim 1, wherein a height of the first insulating layer between portions of the raised pattern is greater than a height of the raised pattern before removing portions of the first insulating layer.

10. A method of forming an electronic device including a substrate and a raised pattern on the substrate, the method comprising:
   forming a first insulating layer on the raised pattern and on the substrate wherein forming the first insulating layer comprises forming a first portion of the first insulating layer using a first processing condition and forming a second portion of the first insulating layer using a second processing condition;
   after forming the first insulating layer including the first and second portions, removing portions of the first insulating layer to expose portions of the raised pattern while maintaining portions of the first insulating layer on the substrate; and
   after removing portions of the first insulating layer, forming a second insulating layer on the exposed portions of the raised pattern and on the maintained portions of the first insulating layer;
   wherein the first insulating layer includes closed voids therein, and wherein removing portions of the first insulating layer comprises opening the voids in the first insulating layer, and wherein openings in the voids are substantially at least as wide as any portions of the opened voids between the openings and the substrate;
   wherein forming the first portion of the first insulating layer using the first processing condition comprises forming the first portion of the first insulating layer using a first pressure, and forming the second portion of the first insulating layer using the second processing condition comprises forming the second portion of the first insulating layer using a second pressure different than the first pressure.

11. A method of forming an electronic device including a substrate and a raised pattern on the substrate, the method comprising:
   forming a first insulating layer on the raised pattern and on the substrate wherein forming the first insulating layer comprises forming a first portion of the first insulating layer using a first processing condition and forming a second portion of the first insulating layer using a second processing condition;
   after forming the first insulating layer including the first and second portions, removing portions of the first insulating layer to expose portions of the raised pattern while maintaining portions of the first insulating layer on the substrate; and
   after removing portions of the first insulating layer, forming a second insulating layer on the exposed portions of the raised pattern and on the maintained portions of the first insulating layer;
   wherein the first insulating layer includes closed voids therein, and wherein removing portions of the first insulating layer comprises opening the voids in the first insulating layer, and wherein openings in the voids are substantially at least as wide as any portions of the opened voids between the openings and the substrate
   wherein forming the first portion of the first insulating layer using the first processing condition comprises forming the first portion of the first insulating layer using a first bias power, and forming the second portion of the first insulating layer using the second processing condition comprises forming the second portion of the first insulating layer using a second bias power different than the first bias power.

12. A method of forming an electronic device including a substrate and a raised pattern on the substrate, the method comprising:
   forming a first insulating layer on the raised pattern and on the substrate wherein forming the first insulating layer comprises forming a first portion of the first insulating layer using a first processing condition and forming a second portion of the first insulating layer using a second processing condition;
   after forming the first insulating layer including the first and second portions, removing portions of the first insulating layer to expose portions of the raised pattern while maintaining portions of the first insulating layer on the substrate; and
   after removing portions of the first insulating layer, forming a second insulating layer on the exposed portions of the raised pattern and on the maintained portions of the first insulating layer;
   wherein the first insulating layer includes closed voids therein, and wherein removing portions of the first insulating layer comprises opening the voids in the first insulating layer, and wherein openings in the voids are substantially at least as wide as any portions of the opened voids between the openings and the substrate
   wherein forming the first portion of the first insulating layer using the first processing condition comprises forming the first portion of the first insulating layer using a pressure in the range of about 1 milliTorr to about 5 milliTorr and a bias power in the range of about 500 Watts to about 1500 Watts.

13. The method according to claim 12, wherein forming the first portion of the first insulating layer using the first processing condition comprises using a processing gas including an oxygen gas at a flow rate in the range of about 30 sccm to about 150 sccm, a helium gas at a flow rate in the range of about 10 sccm to about 200 sccm, and a silane gas at a flow rate in the range of about 10 sccm to about 100 sccm.

14. A method of forming an electronic device including a substrate and a raised pattern on the substrate, the method comprising:
   forming a first insulating layer on the raised pattern and on the substrate wherein forming the first insulating layer comprises forming a first portion of the first insulating layer using a first processing condition and forming a second portion of the first insulating layer using a second processing condition;

after forming the first insulating layer including the first and second portions, removing portions of the first insulating layer to expose portions of the raised pattern while maintaining portions of the first insulating layer on the substrate; and after removing portions of the first insulating layer, forming a second insulating layer on the exposed portions of the raised pattern and on the maintained portions of the first insulating layer;

wherein the first insulating layer includes closed voids therein, and wherein removing portions of the first insulating layer comprises opening the voids in the first insulating layer, and wherein openings in the voids are substantially at least as wide as any portions of the opened voids between the openings and the substrate;

wherein removing portions of the first insulating layer comprises etching back portions of the first insulating layer without mechanical polishing while etching back;

wherein removing portions of the first insulating layer further comprises mechanical polishing separate from etching back.

15. A method of forming an electronic device including a substrate and a raised pattern on the substrate, the method comprising:

forming a first insulating layer on the raised pattern and on the substrate wherein a height of the first insulating layer between portions of the raised pattern is greater than a height of the raised pattern;

after forming the first insulating layer, removing portions of the first insulating layer while maintaining portions of the first insulating layer so that the raised pattern extends beyond the maintained portions of the first insulating layer and so that the maintained portions of the first insulating layer are recessed between portions of the raised pattern; and after removing portions of the first insulating layer, forming a second insulating layer on exposed portions of the raised pattern and on the maintained portions of the first insulating layer;

wherein the first insulating layer includes closed voids therein, and wherein removing portions of the first insulating layer comprises opening the voids in the first insulating layer wherein openings in the voids are substantially at least as wide as portions of the opened voids between the openings and the substrate;

wherein removing portions of the first insulating layer further comprises mechanical polishing separate from etching back.

16. A method of forming an electronic device including a substrate and a raised pattern on the substrate, the method comprising:

forming a first insulating layer on the raised pattern and on the substrate wherein a height of the first insulating layer between portions of the raised pattern is greater than a height of the raised pattern;

after forming the first insulating layer, removing portions of the first insulating layer while maintaining portions of the first insulating layer so that the raised pattern extends beyond the maintained portions of the first insulating layer and so that the maintained portions of the first insulating layer are recessed between portions of the raised pattern; and after removing portions of the first insulating layer, forming a second insulating layer on exposed portions of the raised pattern and on the maintained portions of the first insulating layer;

wherein the first insulating layer includes closed voids therein, and wherein removing portions of the first insulating layer comprises opening the voids in the first insulating layer wherein openings in the voids are substantially at least as wide as portions of the opened voids between the openings and the substrate;

wherein forming the first insulating lever comprises forming a first portion of the first insulating layer using a first processing condition including a first pressure and a first bias power and forming a second portion of the first insulating layer using a second processing condition including a second pressure different than the first pressure and a second bias power different than the first bias power.

17. The method according to claim 16, wherein removing portions of the first insulating layer comprises etching back portions of the first insulating layer without mechanical polishing while etching back.

18. The method according to claim 16, wherein the closed voids are located in the first insulating layer between portions of the raised pattern.

19. The method according to claim 18, wherein the second insulating layer fills the opened voids.

* * * * *